(12) United States Patent
Morozumi et al.

(10) Patent No.: US 10,128,167 B2
(45) Date of Patent: Nov. 13, 2018

(54) SEMICONDUCTOR MODULE AND MANUFACTURING METHOD OF SEMICONDUCTOR MODULE

(71) Applicant: FUJI ELECTRIC CO., LTD., Kanagawa (JP)

(72) Inventors: Akira Morozumi, Okaya (JP); Hiromichi Gohara, Matsumoto (JP); Yoshitaka Nishimura, Azumino (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 0 days.

(21) Appl. No.: 15/418,787

(22) Filed: Jan. 30, 2017

(65) Prior Publication Data
US 2017/0271239 A1 Sep. 21, 2017

(30) Foreign Application Priority Data

Mar. 15, 2016 (JP) ................. 2016-051070

(51) Int. Cl.
| | |
|---|---|
| H01L 23/473 | (2006.01) |
| H01L 21/50 | (2006.01) |
| H01L 23/053 | (2006.01) |
| H01L 23/40 | (2006.01) |
| H01L 23/42 | (2006.01) |
| H01L 25/11 | (2006.01) |

(52) U.S. Cl.
CPC ............ *H01L 23/473* (2013.01); *H01L 21/50* (2013.01); *H01L 23/053* (2013.01); *H01L 23/4006* (2013.01); *H01L 23/42* (2013.01); *H01L 25/115* (2013.01); *H01L 2023/4031* (2013.01); *H01L 2023/4087* (2013.01)

(58) Field of Classification Search
CPC ......... H01L 23/46–23/4735; H01L 2023/4056
See application file for complete search history.

(56) References Cited

U.S. PATENT DOCUMENTS

| | | | |
|---|---|---|---|
| 2008/0224303 A1* | 9/2008 | Funakoshi | ............ H01L 23/051 257/701 |
| 2015/0041187 A1 | 2/2015 | Hori et al. | |
| 2016/0201993 A1* | 7/2016 | Rumpunen | ........... H01L 23/427 165/104.14 |

FOREIGN PATENT DOCUMENTS

| | | |
|---|---|---|
| JP | 2006-324647 A | 11/2006 |
| JP | 2008-218940 A | 9/2008 |
| JP | 2011-109000 A | 6/2011 |
| JP | 2011-210746 A | 10/2011 |
| JP | 2012-178513 A | 9/2012 |
| JP | 2014-096910 A | 5/2014 |

* cited by examiner

*Primary Examiner* — Daniel Shook

(57) ABSTRACT

A semiconductor module is provided, including: a cooling-target device; a first cooling unit on which the cooling-target device is placed and that has a flow channel through which a refrigerant for cooling the cooling-target device flows; and a second cooling unit to which the first cooling unit is fixed and that has a flow channel coupled with the flow channel of the first cooling unit. Also, a semiconductor module manufacturing method is provided, including: placing a cooling-target device on a first cooling unit that has a flow channel through which a refrigerant for cooling the cooling-target device flows; and fixing the first cooling unit to a second cooling unit that has a flow channel coupled with the flow channel of the first cooling unit.

18 Claims, 23 Drawing Sheets

US 10,128,167 B2

SEMICONDUCTOR MODULE AND MANUFACTURING METHOD OF SEMICONDUCTOR MODULE

The contents of the following Japanese patent application(s) are incorporated herein by reference:

NO. 2016-051070 filed in JP on Mar. 15, 2016

BACKGROUND

1. Technical Field

The present invention relates to a semiconductor module and a semiconductor module manufacturing method.

2. Related Art

Conventionally, a structure in a semiconductor module in which a semiconductor device is provided with a cooler to cool the semiconductor device has been known (please see Patent Documents 1 to 6, for example).

Patent Document 1: Japanese Patent Application Publication No. 2014-096910

Patent Document 2: Japanese Patent Application Publication No. 2006-324647

Patent Document 3: Japanese Patent Application Publication No. 2011-210746

Patent Document 4: Japanese Patent Application Publication No. 2011-109000

Patent Document 5: Japanese Patent Application Publication No. 2012-178513

Patent Document 6: Japanese Patent Application Publication No. 2008-218940

However, because in a conventional semiconductor module, a semiconductor device and a cooler are connected by using a compound, grease or the like, the thermal resistance between the semiconductor device and the cooler increases. Also, because the cooler having a large heat capacity is soldered after resin-sealing of the semiconductor device, the melting point of a resin limits the bonding temperature of solder, and the reliability of bonding between the semiconductor device and the cooler deteriorates.

SUMMARY

A first aspect of the present invention provides a semiconductor module including: a cooling-target device; a first cooling unit on which the cooling-target device is placed and that has a flow channel through which a refrigerant for cooling the cooling-target device flows; and a second cooling unit to which the first cooling unit is fixed and that has a flow channel coupled with the flow channel of the first cooling unit.

The semiconductor module may further include an insulating layer that covers the cooling-target device and at least partially contacts the first cooling unit.

A volume of a housing of the first cooling unit may be smaller than a volume of a housing of the second cooling unit.

The semiconductor module may include: a plurality of the cooling-target devices; and a plurality of the first cooling units each of which has at least one among the plurality of cooling-target devices placed thereon. The plurality of first cooling units may be respectively fixed to the second cooling unit.

The second cooling unit may have a lower thermal conductivity than that of the first cooling unit.

The second cooling unit may have: a first plate portion that is fixed to the first cooling unit and includes a flow channel coupled with the flow channel of the first cooling unit; and a second plate portion that is fixed to the first plate portion and includes a flow channel coupled with the flow channel of the first plate portion.

At least part of the flow channel of the second plate portion may be formed of a groove formed in the second plate portion and a surface of the first plate on the second plate portion side.

The first cooling unit may have a protrusion provided with the flow channel of the first cooling unit, the flow channel protruding to the second cooling unit side.

The protrusion may protrude from the first cooling unit side to the first plate portion.

The protrusion may penetrate the first plate portion and protrude past the first plate portion to the second plate portion side.

The protrusion may include, inside the flow channel of the second cooling unit, a coupling portion that has a diameter which is larger than a diameter of the protrusion.

The first plate portion may include a material different from that of the second plate portion.

The second plate portion may be formed of a material which is the same as that of the first cooling unit.

The first plate portion may have a coefficient of thermal expansion lower than that of the first cooling unit.

The semiconductor module may further include a screw that fixes the second cooling unit and the first cooling unit together by penetrating the second cooling unit and coupling with the first cooling unit.

The semiconductor module may further include a third plate unit that is arranged between the first cooling unit and the second cooling unit, fixed to the first cooling unit, and screwed together with the second cooling unit.

A second aspect of the present invention provides a semiconductor module manufacturing method including:

placing a cooling-target device on a first cooling unit that has a flow channel through which a refrigerant for cooling the cooling-target device flows; and fixing the first cooling unit to a second cooling unit that has a flow channel coupled with the flow channel of the first cooling unit.

The semiconductor module manufacturing method may further include covering the cooling-target device with an insulating layer after placing the cooling-target device on the first cooling unit.

The summary clause does not necessarily describe all necessary features of the embodiments of the present invention. The present invention may also be a sub-combination of the features described above.

BEST MODE FOR CARRYING OUT THE INVENTION

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

First Example

Figure 1:
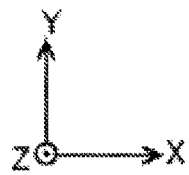
FIG. 1 shows an exemplary configuration of a semiconductor module 100 according to a first example.
Figure 1:
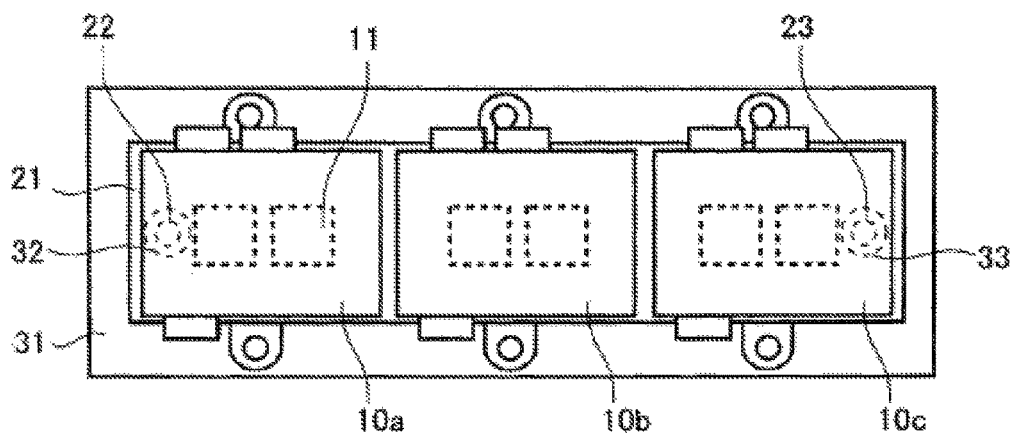
Figure 2:
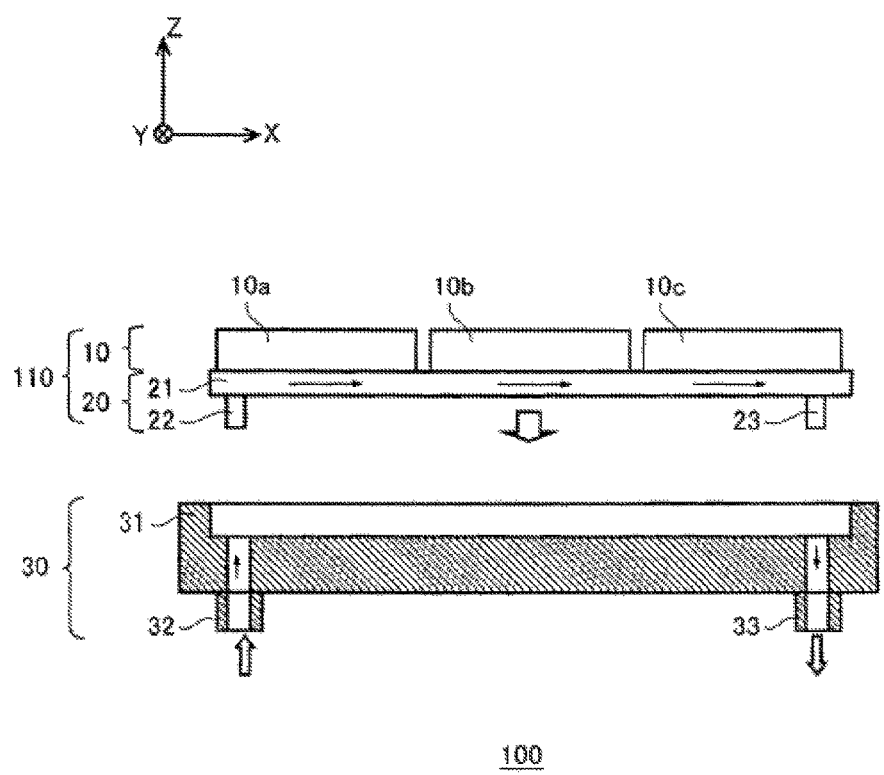
FIG. 2 shows an exemplary cross-sectional view of the semiconductor module 100 according to the first example.

FIG. 1 shows an exemplary configuration of a semiconductor module 100 according to a first example. FIG. 2 shows an exemplary cross-sectional view of the semiconductor module 100 according to the first example. In the cross-sectional view of the semiconductor module 100, the configurations of an external terminal and the like are omitted in order to make the view concise. The semiconductor module 100 includes a cooling-target module 10, a first cooling unit 20 and a second cooling unit 30. The cooling-target module 10 and the first cooling unit 20 constitute a cooling-target unit 110.

In the present specification, the X-direction and the Y-direction are directions vertical to each other, and the Z-direction is a direction vertical to the X-Y plane. The X-direction, Y-direction and Z-direction define a so-called right-handed system. The semiconductor substrate in the present example has a front surface facing the +Z-direction, and a rear surface facing the −Z-direction. "on" and "above" correspond to the +Z-direction. On the contrary, "down" and "below" correspond to the −Z-direction.

The cooling-target module 10 has one or more cooling-target devices 11. The semiconductor module 100 in the present example includes, as the cooling-target module 10, three cooling-target modules 10a, 10b, 10c. The cooling-target modules 10a, 10b, 10c each have a set of two cooling-target devices 11.

The cooling-target devices 11 are exemplary semiconductor chips. In one example, the cooling-target devices 11 are reverse-conducting IGBTs (RC-IGBTs). For example, the semiconductor module 100 has three units of sets of two RC-IGBTs, and thereby constitutes a three-phase inverter with a set of six RC-IGBTs.

The cooling-target module 10 is placed on the first cooling unit 20. The first cooling unit 20 has a heatsink unit 21, an inlet protrusion 22 and an outlet protrusion 23. The heatsink unit 21, the inlet protrusion 22 and the outlet protrusion 23 have therein refrigerant flow channels through which a refrigerant for cooling the cooling-target module 10 flows. In one example, a material of the first cooling unit 20 includes at least one among copper, a copper alloy, aluminum, an aluminum alloy, iron, a ferroalloy, titanium and a titanium alloy.

For example, the first cooling unit 20 may be fabricated by: fabricating 20 sheets of copper boards having thickness of 0.2 mm on which a plurality of through-holes for water channel are formed by etching; and laminating them one on another by solid phase diffusion bonding. Solid phase diffusion bonding refers to bonding by diffusion of atoms in their solid-phase states. A surface treatment with nickel or the like may be performed on a front surface of the first cooling unit 20.

The heatsink unit 21 has therein a refrigerant flow channel through which a refrigerant flows. The heatsink unit 21 in the present example has a refrigerant flow channel through which a refrigerant flows from the X-axis negative-side toward the positive-side thereof. The heatsink unit 21 is formed with a size according to the size and number of the cooling-target module 10. The heatsink unit 21 in the present example is formed with a size that allows placement of the three cooling-target modules 10a, 10b, 10c on it. The heatsink unit 21 is provided in contact with the cooling-target module 10, and cools the heat-generating cooling-target module 10 with a refrigerant. For example, the heatsink unit 21 is formed of stainless steel.

The inlet protrusion 22 has a refrigerant flow channel coupled with a refrigerant flow channel of the heatsink unit 21. The inlet protrusion 22 in the present example is coupled with the refrigerant flow channel on the X-axis negative-side of the heatsink unit 21. A refrigerant enters the inlet protrusion 22 from the second cooling unit 30. The inlet protrusion 22 is provided protruding from the heatsink unit 21. The inlet protrusion 22 in the present example is provided protruding from the heatsink unit 21 to the second cooling unit 30 side. The position at which the inlet protrusion 22 is provided is not limited by the present example.

The outlet protrusion 23 has a refrigerant flow channel coupled with the refrigerant flow channel of the heatsink unit 21. The outlet protrusion 23 in the present example is coupled with the refrigerant flow channel on the X-axis positive side of the heatsink unit 21. A refrigerant exits the outlet protrusion 23 to the second cooling unit 30. The outlet protrusion 23 is provided protruding from the heatsink unit 21. The outlet protrusion 23 in the present example is provided protruding from the first cooling unit 20 to the second cooling unit 30 side. The position at which the outlet protrusion 23 is provided is not limited by the present example.

For example, the inlet protrusion 22 and the outlet protrusion 23 are used for positioning of the first cooling unit 20 and the second cooling unit 30 if the first cooling unit 20 is fixed to the second cooling unit 30. Also, the inlet protrusion 22 and the outlet protrusion 23 couple the refrigerant flow channel of the first cooling unit 20 and the refrigerant flow channel of the second cooling unit 30, and prevent leakage of a refrigerant.

One or more first cooling units 20 are fixed to the second cooling unit 30. The second cooling unit 30 includes a cooler housing 31, an inlet pipe 32 and an outlet pipe 33. The second cooling unit 30 has a refrigerant flow channel through which a refrigerant for cooling the cooling-target module 10 flows. The second cooling unit 30 is coupled with the refrigerant flow channel of the heatsink unit 21 via the refrigerant flow channels of the inlet protrusion 22 and the outlet protrusion 23. In one example, a material of the second cooling unit 30 includes at least one among aluminum, an aluminum alloy, copper, a copper alloy, iron, a ferroalloy, titanium, a titanium alloy and a composite material of aluminum and silicon carbide.

Also, the second cooling unit 30 may have a lower thermal conductivity than that of the first cooling unit 20. Thereby, influence, on the cooling-target module 10, of a heat source on the rear side of the second cooling unit 30 can be suppressed. For example, the second cooling unit 30 is formed of resin.

The cooler housing 31 has a hollow corresponding to the shape of the first cooling unit 20 so that the first cooling unit 20 can be fixedly placed thereon. A plurality of the first cooling units 20 may be fixedly placed on the cooler housing 31. In one example, the cooler housing 31 has hollows that match the respective shapes of the heatsink unit 21, the inlet protrusion 22 and the outlet protrusion 23. Thereby, the cooler housing 31 fixes the heatsink unit 21, the inlet protrusion 22 and the outlet protrusion 23, and couples their refrigerant flow channels with each other. The cooler housing 31 is an exemplary water jacket.

The inlet pipe 32 is coupled with a refrigerant flow channel provided outside the second cooling unit 30. The inlet pipe 32 is provided corresponding to the inlet protrusion 22. The inlet pipe 32 in the present example is coupled with the inlet protrusion 22 on the X-axis negative-side of the cooler housing 31. A refrigerant is caused to enter the inlet pipe 32 from the outside.

The outlet pipe 33 is coupled with a refrigerant flow channel provided outside the second cooling unit 30. The outlet pipe 33 is provided corresponding to the outlet protrusion 23. The outlet pipe 33 in the present example is coupled with the outlet protrusion 23 on the X-axis positive side of the cooler housing 31. A refrigerant that has been caused to enter the second cooling unit 30 from the first cooling unit 20 exits from the outlet pipe 33. The inlet pipe 32 and the outlet pipe 33 may be connected with a radiator pump.

In the above-mentioned manner, the semiconductor module 100 in the present example cools the three cooling-target modules 10a, 10b, 10c by flowing a refrigerant through the refrigerant flow channels. Although in the semiconductor module 100 in the present example, the cooling-target module 10 is provided above the first cooling unit 20 and the second cooling unit 30, the cooling-target module 10 may be provided below the first cooling unit 20 and the second cooling unit 30.

First Comparative Example

Figure 3:
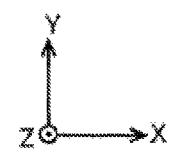
FIG. 3 shows an exemplary configuration of a semiconductor module 500 according to a first comparative example.
Figure 3:
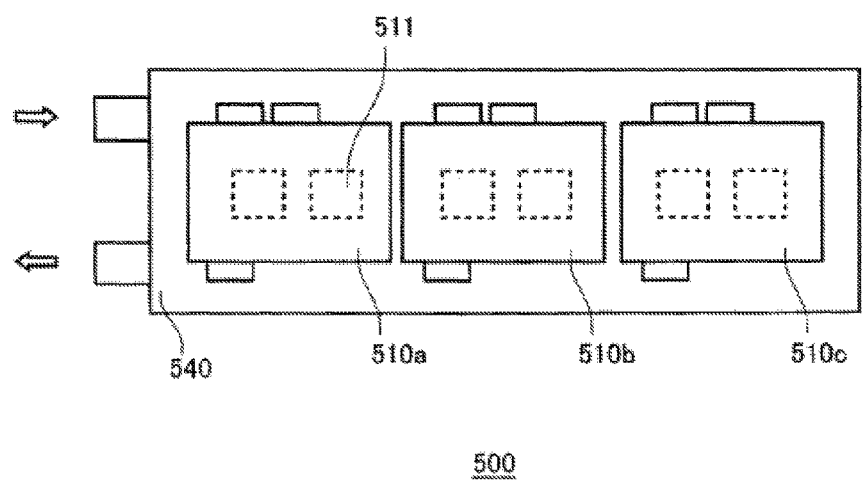
Figure 4:
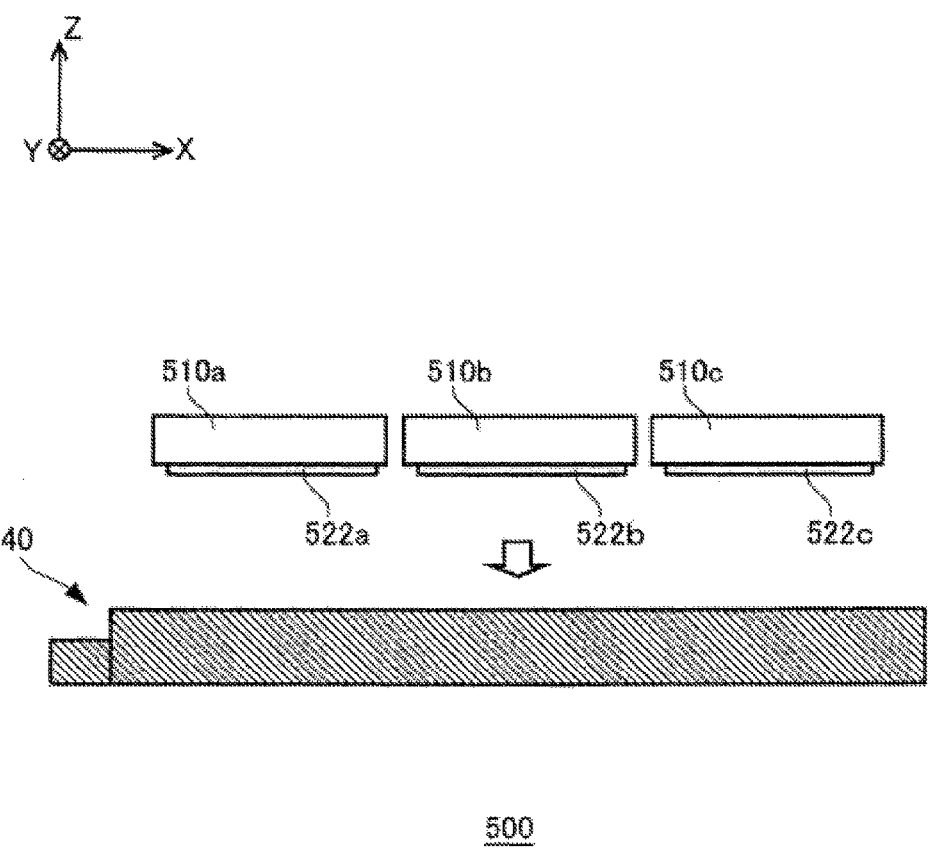
FIG. 4 shows an exemplary cross-sectional view of the semiconductor module 500 according to the first comparative example.

FIG. 3 shows an exemplary configuration of a semiconductor module 500 according to a first comparative example. FIG. 4 shows an exemplary cross-sectional view of the semiconductor module 500 according to the first comparative example.

The semiconductor module 500 includes a cooling-target module 510, a rear surface copper circuit board 522 and a cooler 540. The semiconductor module 500 includes, as the cooling-target module 510, three cooling-target modules 510a, 510b, 510c.

The cooling-target modules 510a, 510b, 510c each have a set of two cooling-target devices 511. The cooling-target devices 511 in the present example are RC-IGBT chips. The rear surface copper circuit board 522 is attached below the cooling-target module 510. The cooling-target modules 510a, 510b, 510c are soldered on the cooler 540 via rear surface copper circuit boards 522a, 522b, 522, respectively.

Figure 5:
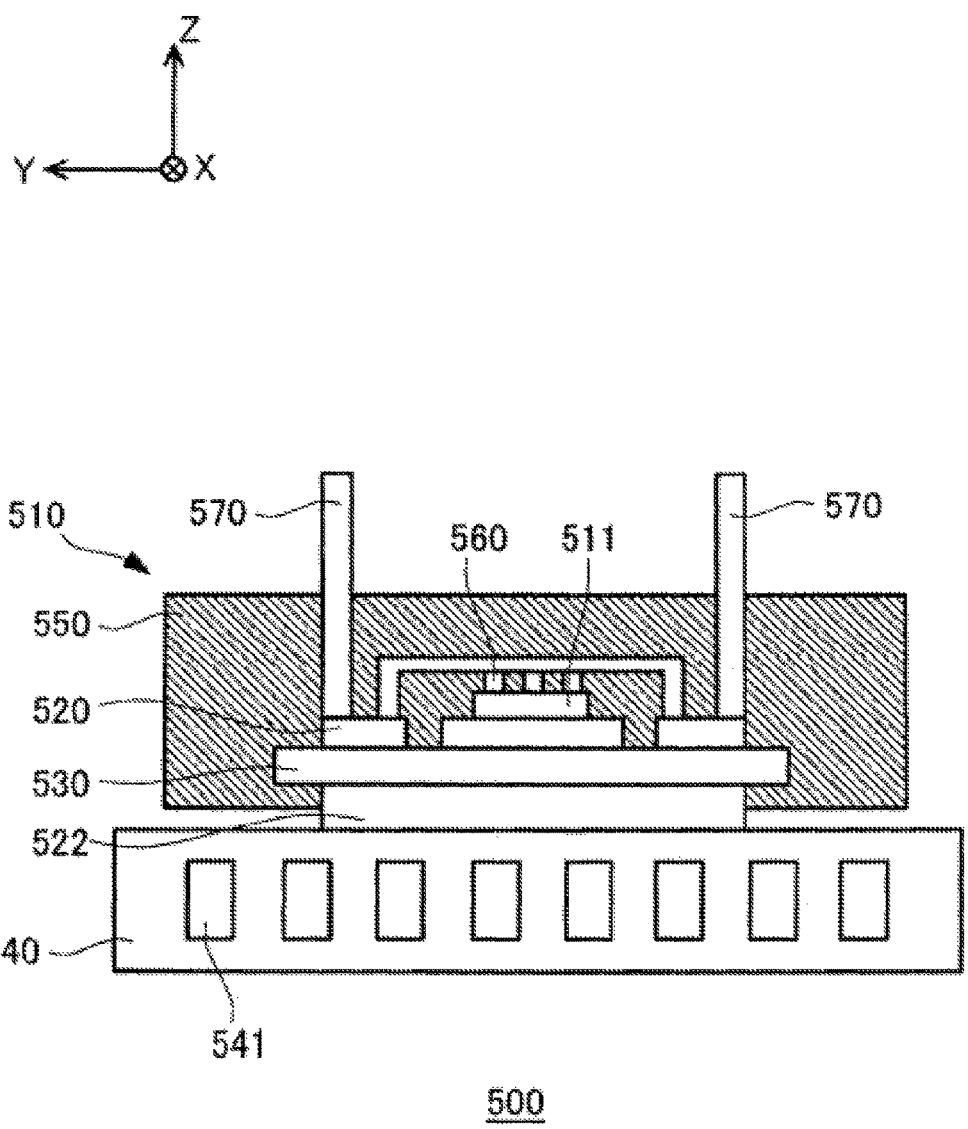
FIG. 5 shows an exemplary cross-sectional view of the semiconductor module 500 according to the first comparative example.

FIG. 5 shows an exemplary cross-sectional view of the semiconductor module 500 according to the first comparative example. The figure shows a more specific configuration of the semiconductor module 500.

The cooling-target device 511 is attached onto a ceramic substrate 530 via a front surface copper circuit board 520. The cooling-target device 511 is electrically connected with the front surface copper circuit board 520 by copper pin terminals 560. The semiconductor module 500 cools the cooling-target device 511 formed on the ceramic substrate 530 by flowing a refrigerant through refrigerant flow channels 541 formed in the cooler 540. The cooling-target device 511 is covered by a resin portion 550, and is electrically connected with the outside by external terminals 570.

In a process of manufacturing the semiconductor module 500, the rear surface copper circuit board 522 is attached to the cooling-target module 510 as shown in FIG. 4, and then the rear surface copper circuit board 522 is soldered to the cooler 540. However, because at the time of solder-bonding of the rear surface copper circuit board 522, it is necessary to heat the cooler 540 having a high heat capacity to the melting temperature (of soldering) or higher (for example, approximately 250 to 350° C.), soldering takes a longer time, and production efficiency lowers in some cases. Heat-radiating grease or the like may possibly be used for bonding between the rear surface copper circuit board 522 and the cooler 540, in this case, the thermal resistance increases because the thermal conductivity of the heat-radiating grease or the like is lower than that of metal.

Also, in a process of manufacturing the semiconductor module 500, the resin portion 550 is formed to cover the cooling-target device 511, and then the rear surface copper circuit board 522 is soldered to the cooler 540. Accordingly, the temperature at which it is soldered to the cooler 540 is limited by the heat resisting temperature or the glass transition temperature of the resin portion 550. If the soldering temperature is limited by the melting point of the resin portion 550, a sufficient temperature necessary for soldering cannot be attained. Also, a soldering material is significantly restricted, and the reliability lowers if a soldering material having a low melting point is applied. If adhesion between the resin portion 550 and the cooler 540 becomes insufficient, interfacial peeling or degradation of a solder-bonded portion becomes noticeable so that the reliability of the semiconductor module 500 lowers in some cases.

Furthermore, if soldering is performed by using flux, it becomes necessary to wash the semiconductor module 500 to which the cooler 540 having a large volume is bonded, and the production efficiency lowers. In this manner, a step of manufacturing the semiconductor module 500 causes lowering of the yield and an increase in the assembling cost in some cases.

Second Example

Figure 6:
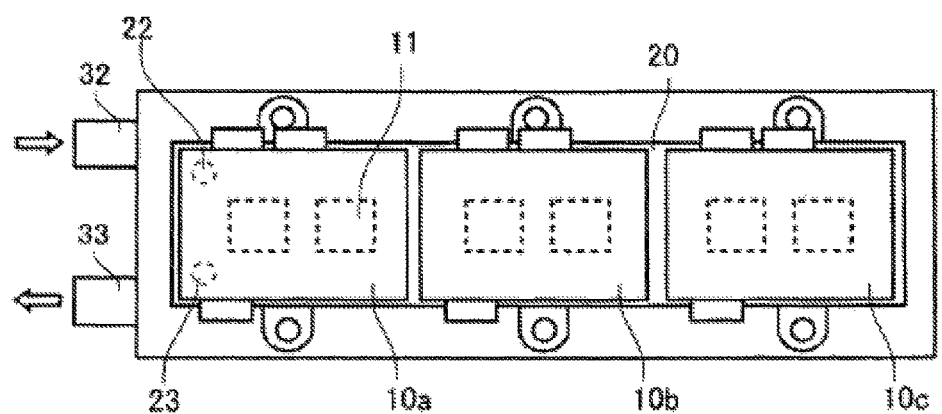
FIG. 6 shows an exemplary configuration of the semiconductor module 100 according to a second example.

FIG. 6 shows an exemplary configuration of the semiconductor module 100 according to a second example.

Figure 7:
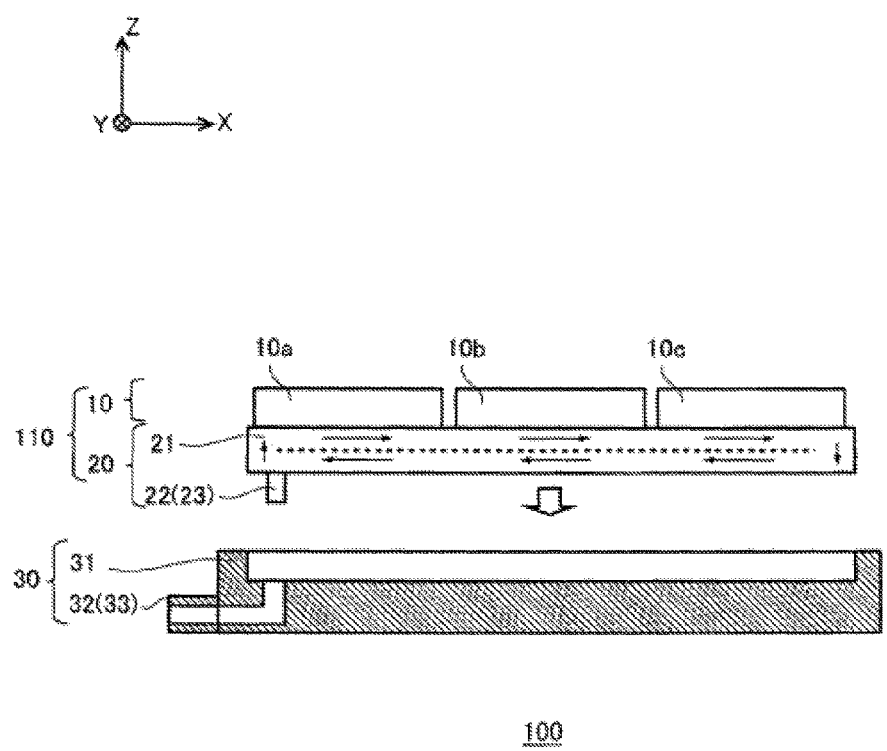
FIG. 7 shows an exemplary cross-sectional view of the semiconductor module 100 according to the second example.

FIG. 7 shows an exemplary cross-sectional view of the semiconductor module 100 according to the second example. In the cross-sectional view of the semiconductor module 100, the configurations of an external terminal and the like are omitted in order to make the view concise. In the semiconductor module 100 in the present example, the structures of the first cooling unit 20 and the second cooling unit 30 are different from those of the semiconductor module 100 according to the first example. In the present example, the differences from the first example are explained in particular.

The first cooling unit 20 includes a refrigerant flow channel through which a refrigerant flows in the X-axis positive side direction, and a refrigerant flow channel through which a refrigerant flows in the X-axis negative-side direction. The first cooling unit 20 in the present example includes the inlet protrusion 22 and the outlet protrusion 23 on the X-axis negative-side in the heatsink unit 21. The first cooling unit 20 has a refrigerant flow channel through which a refrigerant flows in the X-axis positive side direction, the refrigerant flow channel being provided on a side to contact the cooling-target module 10, and cools the first cooling unit 20. The three cooling-target modules 10a, 10b, 10c are placed above the first cooling unit 20.

The second cooling unit 30 has the inlet pipe 32 and the outlet pipe 33 at an end portion on the X-axis negative-side in the cooler housing 31. The inlet pipe 32 is coupled with the inlet protrusion 22 via a refrigerant flow channel of the cooler housing 31. Also, the outlet pipe 33 is coupled with the outlet protrusion 23 via the refrigerant flow channel of the cooler housing 31.

Third Example

Figure 8:
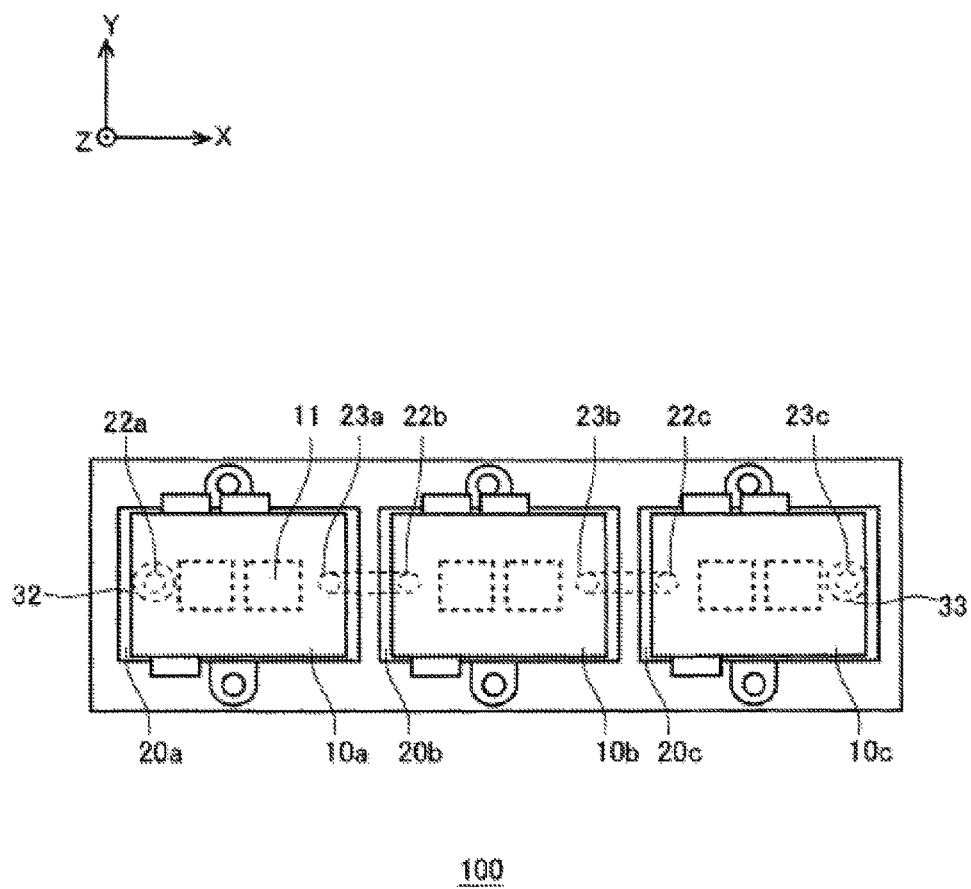
FIG. 8 shows an exemplary configuration of the semiconductor module 100 according to a third example.

FIG. 8 shows an exemplary configuration of the semiconductor module 100 according to a third example.

Figure 9:
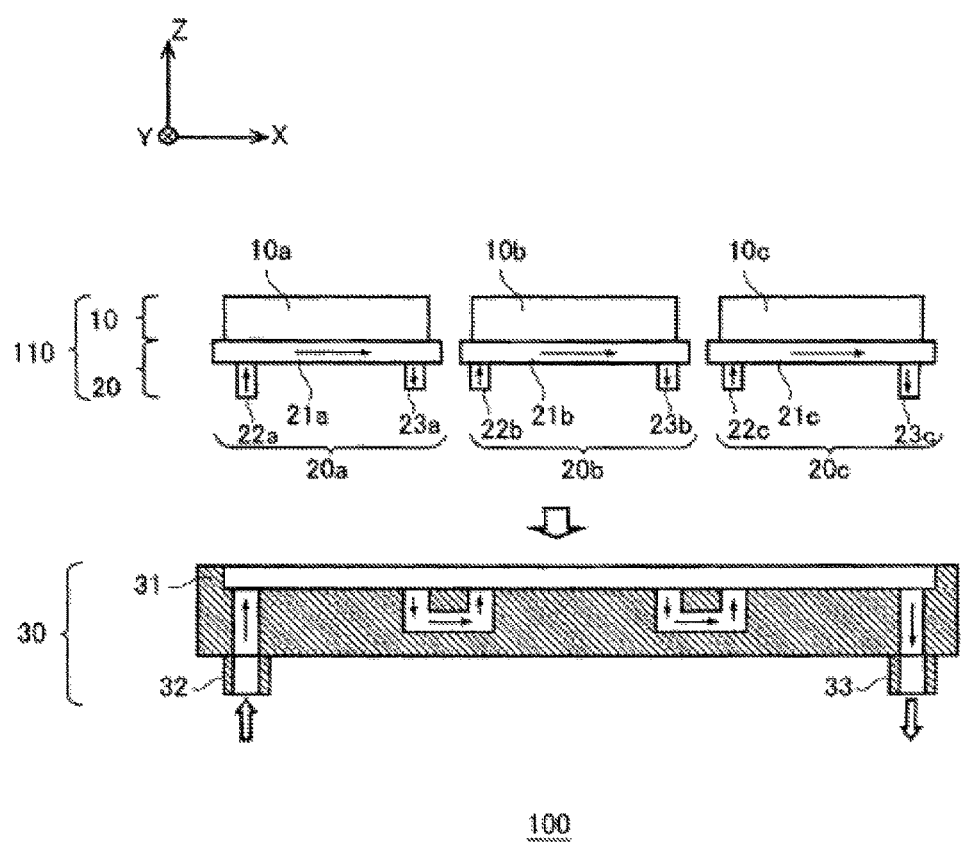
FIG. 9 shows an exemplary cross-sectional view of the semiconductor module 100 according to the third example.

FIG. 9 shows an exemplary cross-sectional view of the semiconductor module 100 according to the third example. In the cross-sectional view of the semiconductor module 100, the configurations of an external terminal and the like are omitted in order to make the view concise. The semiconductor module 100 includes the three cooling-target modules 10a, 10b, 10c.

The first cooling units 20 include a first cooling unit 20a, a first cooling unit 20b, and a first cooling unit 20c. The number of the first cooling units 20 may be altered as appropriate depending on the number the cooling-target modules 10. The first cooling units 20a, 20b, 20c each have a volume smaller than that of the second cooling unit 30. In other words, because the first cooling units 20a, 20b, 20c have heat capacities which are lower as compared with the second cooling unit 30, heating takes a shorter time as compared with the second cooling unit 30. Also, because the first cooling units 20a, 20b, 20c each have a small volume, they are easy to wash if flux is used. In this manner, the first cooling units 20a, 20b, 20c become easy to handle because they are made separate from each other corresponding to the cooling-target module 10.

The cooling-target module 10a is placed on the first cooling unit 20a. The first cooling unit 20a includes a heatsink unit 21a, an inlet protrusion 22a and an outlet protrusion 23a. The first cooling unit 20a and the cooling-target module 10a are stuck each other before they are placed on the second cooling unit 30.

The cooling-target module 10b is placed on the first cooling unit 20b. The first cooling unit 20b includes a heatsink unit 21b, an inlet protrusion 22b and an outlet protrusion 23b. The first cooling unit 20b and the cooling-target module 10b are stuck to each other before they are placed on the second cooling unit 30.

The cooling-target module 10c is placed on the first cooling unit 20c. The first cooling unit 20c includes a heatsink unit 21c, an inlet protrusion 22c and an outlet protrusion 23c. The first cooling unit 20c and the cooling-target module 10c are stuck each other before they are placed on the second cooling unit 30.

In the above-mentioned manner, the first cooling unit 20 in the present example is stuck to the cooling-target module 10 before it is placed on the second cooling unit 30. Also, the volume of the first cooling unit 20 is smaller than that of the second cooling unit 30. Accordingly, the cooling-target module 10 is stuck to the first cooling unit 20 in a short time. Also, the first cooling unit 20 in the present example becomes further easier to solder because it has the three first cooling units 20a, 20b, 20c corresponding to the cooling-target modules 10a, 10b, 10c.

In the semiconductor module 100 in the present example, a refrigerant that has passed by the cooling-target module 10a returns to and cooled by the second cooling unit 30, and the cooled refrigerant passes by the cooling-target module 10b. Also, the refrigerant that has passed by the cooling-target module 10b returns to and cooled by the second cooling unit 30, and the cooled refrigerant passes by the cooling-target module 10c. Thereby, the semiconductor module 100 in the present example can cool the cooling-target modules 10a, 10b, 10c evenly.

Fourth Example

Figure 10:
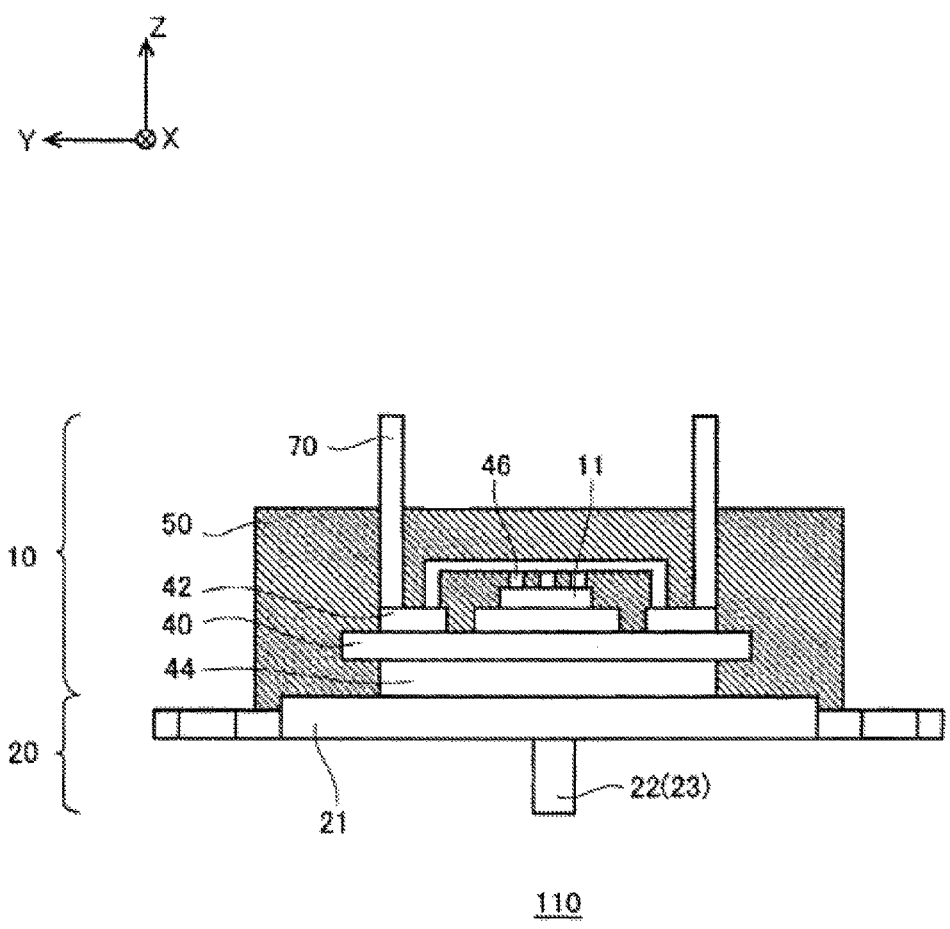
FIG. 10 shows an exemplary configuration of a cooling-target unit 110 according to a fourth example.

FIG. 10 shows an exemplary configuration of a cooling-target unit 110 according to a fourth example. The cooling-target unit 110 is constituted with the cooling-target module 10 and the first cooling unit 20. The cooling-target module 10 in the present example includes, a cooling-target device 11, a substrate 40, a front surface circuit board 42, a rear surface circuit board 44, pin terminals 46, an insulating layer 50 and external terminals 70.

The cooling-target unit 110 is an exemplary semiconductor device having a built-in heatsink. The cooling-target unit 110 is fixed to a cooler housing 31 of the second cooling unit 30. For example, the cooling-target unit 110 is fixed to the cooler housing 31 by a plurality of screws.

The substrate 40 has the front surface circuit board 42 formed on its Z-axis positive-side surface. The substrate 40 in the present example has the rear surface circuit board 44 formed on its Z-axis negative-side surface. In one example, a material of the substrate 40 is a ceramic including at least any of alumina, aluminum nitride and silicon nitride. The substrate 40 in the present example is formed of a silicon nitride ceramic. For example, the thickness of the substrate 40 is 0.32 mm.

The front surface circuit board 42 is a copper circuit having a predetermined pattern. For example, the thickness of the front surface circuit board 42 is 0.4 mm. The front surface circuit board 42 is electrically connected with the cooling-target device 11 and the external terminals 70. In one example, the front surface circuit board 42 is formed of copper, aluminum or a clad of these. Also, a surface treatment with nickel or the like may be performed on a front surface of the front surface circuit board 42.

The rear surface circuit board 44 is a copper circuit having a predetermined pattern. For example, the thickness of the rear surface circuit board 44 is 0.4 mm. The rear surface circuit board 44 is stuck to the heatsink unit 21 of the first cooling unit 20. In one example, the rear surface circuit board 44 is stuck to the heatsink unit 21 by solid phase diffusion bonding. Also, the rear surface circuit board 44 may be stuck by, other than solid phase diffusion bonding, brazing, an organic adhesive or the like. In one example, the rear surface circuit board 44 is formed of copper, aluminum or a clad of these.

The cooling-target device 11 may be soldered, brazed or bonded by solid phase diffusion onto the front surface circuit board 42. Also, a front surface electrode of the cooling-target device 11 is electrically connected with the front surface circuit board 42 by the pin terminals 46.

The insulating layer 50 seals in the cooling-target device 11 mounted on the heatsink unit 21. The insulating layer 50 may be resin. The insulating layer 50 in the present example seals in the cooling-target device 11 after the rear surface circuit board 44 is stuck onto the heatsink unit 21. At least part of the insulating layer 50 is connected with the heatsink unit 21.

Here, in order to obtain an excellent heat-radiating property, the semiconductor module 100 is preferably stuck by solid phase diffusion bonding, soldering or the like such that the thermal resistance between the rear surface circuit board 44 and the heatsink unit 21 becomes low. In the cooling-target unit 110 in the present example, before being attached to the second cooling unit 30, the rear surface circuit board 44 and the heatsink unit 21 are stuck to each other. In other words, in a process of manufacturing the semiconductor module 100 in the present example, a process such as solid phase diffusion bonding or soldering is unnecessary after the insulating layer 50 is formed. Accordingly, temperatures of these processes are never limited by the melting point of the insulating layer 50.

For example, in order to make rigid the adhesion between the insulating layer 50 and the heatsink unit 21, a surface to contact the insulating layer 50 of the heatsink unit 21 is roughened at the time of resin-sealing using the insulating layer 50. Roughening methods include sandblasting, irregularity forming processing by pressing or the like.

In the cooling-target unit 110 in the present example, the heatsink unit 21 and the rear surface circuit board 44 are stuck to each other by solid phase diffusion bonding. Accordingly, the cooling-target unit 110 provides an excellent high heat-radiating performance, and its size can be further reduced. Also, because in the cooling-target unit 110 in the present example, the heatsink unit 21 and the rear surface circuit board 44 are stuck to each other, and then sealed in by the insulating layer 50, a sticking process such as solder-bonding between the heatsink unit 21 and the rear surface circuit board 44 is unnecessary after the sealing. Also, because in the cooling-target unit 110, the insulating layer 50 and the heatsink unit 21 can adhere to each other rigidly, it excels in the heat-radiating property and reliability.

Also, the cooling-target unit 110 in the present example includes a solder-bonded portion. For example, in the cooling-target unit 110, the cooling-target device 11 and the substrate 40, the cooling-target device 11 and the pin terminals 46, and the external terminals 70 and the front surface circuit board 42 are electrically connected with each other by solder-bonding. That is, solder-bonding between them is performed before the insulating layer 50 is formed. Therefore, the solder-bonding temperature is not limited by the melting point of the insulating layer 50.

Fifth Example

Figure 11:
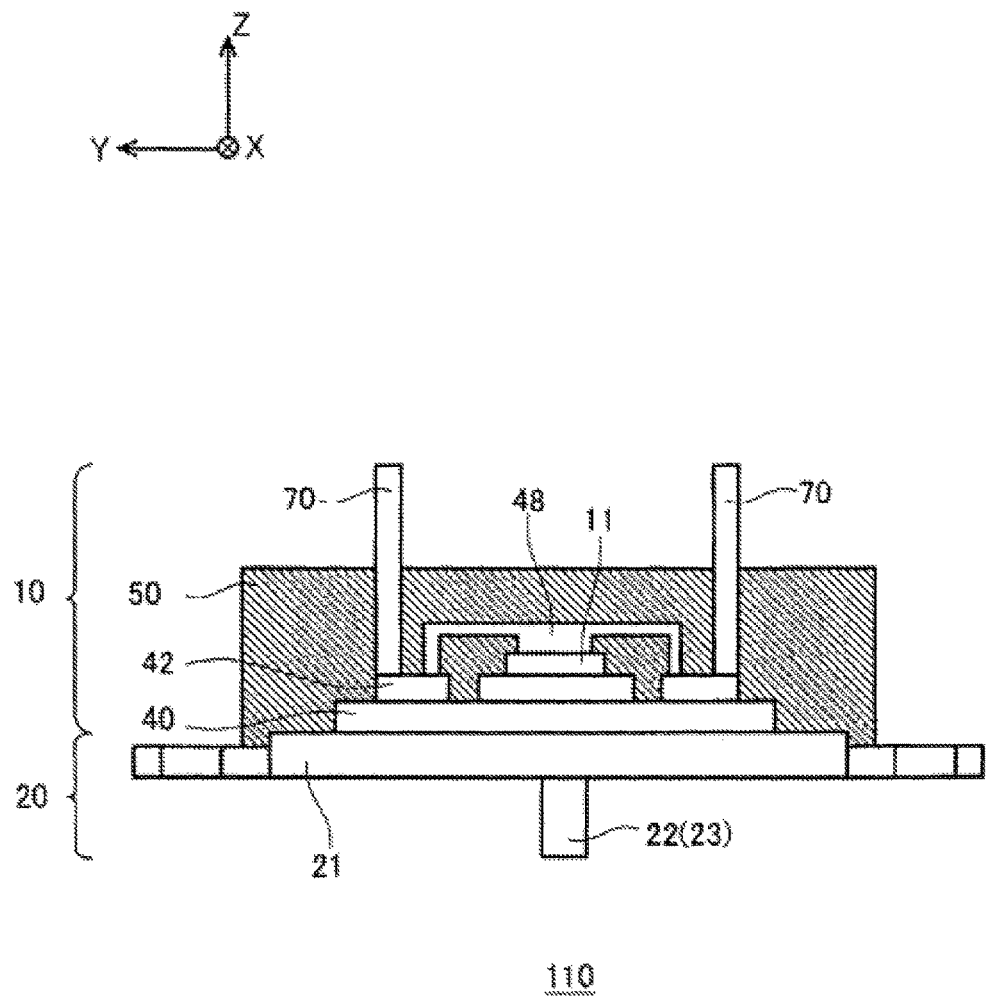
FIG. 11 shows an exemplary configuration of the cooling-target unit 110 according to a fifth example.

FIG. 11 shows an exemplary configuration of the cooling-target unit 110 according to a fifth example. The cooling-target unit 110 in the present example has a circuit board only on a side of the substrate 40 on which the cooling-target device 11 is formed. In other words, the cooling-target unit 110 in the present example has the front surface circuit board 42, but not the rear surface circuit board 44.

The substrate 40 is stuck with the heatsink unit 21 by solid phase diffusion bonding. A method of sticking the substrate 40 and the heatsink unit 21 used is, other than solid phase diffusion bonding, brazing, organic adhesive or the like. The thickness of the substrate 40 in the present example is 0.635 mm, but is not limited thereto.

Here, the substrate 40, if an aluminum nitride ceramic is used, has a high thermal conductivity of 180 W/m·K, and has an excellent heat-radiating property. However, because the substrate 40, if an aluminum nitride ceramic is used, has a weak mechanical strength, if it is stuck to the heatsink unit 21 made of copper, the ceramic may be broken due to a thermal stress generated by a difference in the rates of thermal expansion of copper and aluminum nitride in some cases. Because in the cooling-target unit 110 in the present example, stainless steel having a low rate of thermal expansion is stuck to a ceramic by solid phase diffusion bonding, a thermal stress is reduced, and the ceramic is less likely to be broken.

The front surface circuit board 42 is a copper circuit having a predetermined pattern. For example, the thickness of the front surface circuit board 42 is 0.4 mm. The front surface circuit board 42 is electrically connected with the cooling-target device 11 and the external terminals 70. In one example, the front surface circuit board 42 is formed of copper, aluminum or a clad of these. Also, a surface treatment with nickel or the like may be performed on a front surface of the front surface circuit board 42. The cooling-target device 11 is soldered onto the front surface circuit board 42.

A lead frame 48 electrically connects a front surface electrode of the cooling-target device 11 and the front surface circuit board 42. The lead frame 48 may be formed of copper.

The insulating layer 50 is formed to cover spaces around the cooling-target device 11, the substrate 40, the front surface circuit board 42 and the lead frame 48. At least part of the insulating layer 50 on a side on which the cooling-target device 11 is formed is connected with the heatsink unit 21.

A surface of the heatsink unit 21 that adheres to the insulating layer 50 is, in one example, roughened. Thereby, the heatsink unit 21 can make rigid the adhesion between the insulating layer 50 and the heatsink unit 21. In one example, the surface of the heatsink unit 21 that adheres to the insulating layer 50 is roughened by irregularity forming processing such as sandblasting or pressing, or the like.

The external terminals 70 are electrically connected with the front surface circuit board 42. At least part of the external terminals 70 is exposed to the outside of the insulating layer 50 in order for the external terminals 70 to be electrically connected with the outside of the cooling-target unit 110.

In the cooling-target unit 110 in the present example, the heatsink unit 21 and the substrate 40 are stuck to each other by solid phase diffusion bonding. Accordingly, the cooling-target unit 110 provides an excellent high heat-radiating performance, and its size can be further reduced. Also, because in the cooling-target unit 110 in the present example, the heatsink unit 21 and the substrate 40 are stuck to each other, and then sealed in by the insulating layer 50, a sticking process such as solder-bonding between the heatsink unit 21 and the substrate 40 is unnecessary after the sealing. Also, because in the cooling-target unit 110, the insulating layer 50 and the heatsink unit 21 can adhere to each other rigidly, it excels in the heat-radiating property and reliability.

Also, the cooling-target unit 110 in the present example includes a solder-bonded portion. For example, in the cooling-target unit 110, the cooling-target device 11 and the substrate 40, the cooling-target device 11 and the lead frame 48, and the external terminals 70 and the front surface circuit board 42 are electrically connected with each other by solder-bonding. That is, solder-bonding between them is performed before the insulating layer 50 is formed. Therefore, the solder-bonding temperature is not limited by the melting point of the insulating layer 50.

Sixth Example

Figure 12:
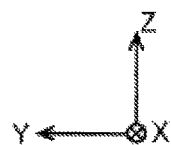
FIG. 12 shows an exemplary configuration of the cooling-target unit 110 according to a sixth example.
Figure 12:
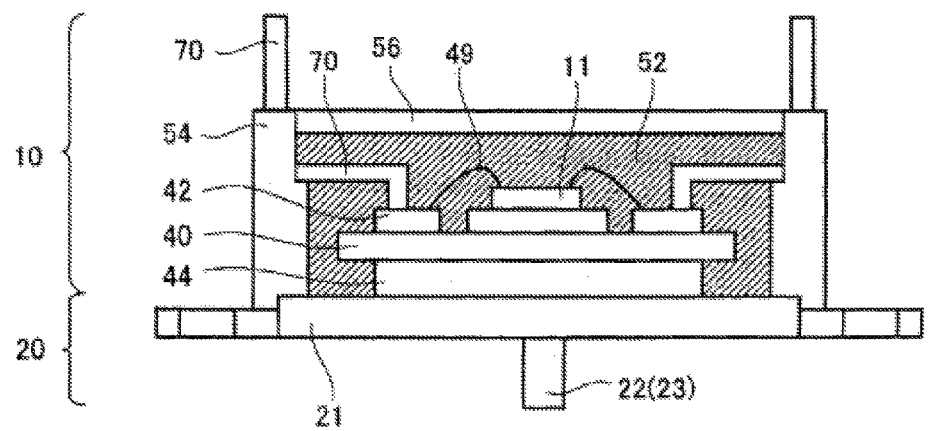

FIG. 12 shows an exemplary configuration of the cooling-target unit 110 according to a sixth example. In the present example, the differences from the fourth example are explained in particular. The cooling-target unit 110 in the present example has wires 49 and a resin case 54.

The wires 49 electrically connect the cooling-target device 11 and the front surface circuit board 42. The wires 49 in the present example are aluminum wires formed of aluminum.

The resin case 54 is provided on the heatsink unit 21. The resin case 54 is insert-molded such that the external terminals 70 are exposed to the outside. The resin case 54 seals therein a gel layer 52. After sealing of the gel layer 52, an upper opening portion of the resin case 54 is closed by a lid 56, and the inside of the resin case 54 is sealed in tightly.

In the cooling-target unit 110 in the present example, the heatsink unit 21 and the rear surface circuit board 44 are stuck to each other by solid phase diffusion bonding. Accordingly, the cooling-target unit 110 provides an excellent high heat-radiating performance, and its size can be further reduced. Also, because in the cooling-target unit 110 in the present example, the heatsink unit 21 and the rear surface circuit board 44 are stuck to each other, and then sealed in by the insulating layer 50, a sticking process such as solder-bonding between the heatsink unit 21 and the rear surface circuit board 44 is unnecessary after the sealing. Also, because in the cooling-target unit 110, the insulating layer 50 and the heatsink unit 21 can adhere to each other rigidly, it excels in the heat-radiating property and reliability.

Also, the cooling-target unit 110 in the present example includes a solder-bonded portion. For example, in the cooling-target unit 110, the cooling-target device 11 and the substrate 40, and the external terminals 70 and the front surface circuit board 42 are electrically connected with each other by solder-bonding. That is, solder-bonding between them is performed before the insulating layer 50 is formed. Therefore, the solder-bonding temperature is not limited by the melting point of the insulating layer 50.

Figure 13A:
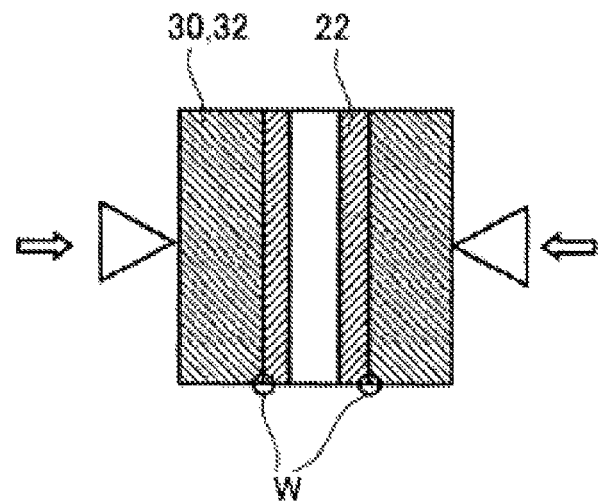
FIG. 13A shows an exemplary inlet protrusion 22 and inlet pipe 32 that are coupled with each other.

FIG. 13A shows an exemplary inlet protrusion 22 and inlet pipe 32 that are coupled with each other. The first cooling unit 20 is fixed to the inlet pipe 32 of the second cooling unit 30 by at least one step among a swaging step, a welding step and a friction compressing step. Also, the first cooling unit 20 may be fixed to the inlet pipe 32 by a combination of two or more among a swaging step, a welding step and a friction compressing step. Although a case where the inlet protrusion 22 is coupled to the inlet pipe 32 is explained in the present example, the outlet protrusion 23 also may be coupled to the outlet pipe 33 by a similar step.

The inlet protrusion 22 is inserted to a refrigerant flow channel of the inlet pipe 32. A refrigerant flow channel of the first cooling unit 20 has a diameter smaller than the refrigerant flow channel of the inlet pipe 32.

In a swaging step, the inlet protrusion 22 is swaged in any region of the inlet pipe 32. The inlet protrusion 22 in the present example is swaged at a region near the center of the protruding inlet pipe 32. The inlet protrusion 22 and the inlet pipe 32 in the present example are exemplary swaged portions formed by a swaging step.

In a welding step, the inlet protrusion 22 is welded together with the inlet pipe 32 at a welded portion W. The welded portion W in the present example is provided at an end portion of the inlet protrusion 22 and an end portion of the inlet pipe 32. Thereby, the inlet protrusion 22 is stuck with the inlet pipe 32 in an air-tight manner.

Figure 13B:
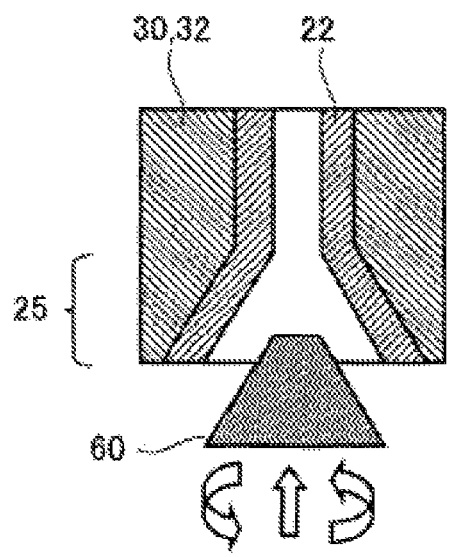
FIG. 13B shows an exemplary configuration of a coupling portion 25.

FIG. 13B shows an exemplary configuration of a coupling portion 25. By a friction compressing step, the first cooling unit 20 is fixed to the inlet pipe 32 of the second cooling unit 30. Although a case where the inlet protrusion 22 is coupled to the inlet pipe 32 is explained in the present example, the outlet protrusion 23 also may be coupled to the outlet pipe 33 by a similar step.

In a friction compressing step, the coupling portion 25 is formed in the inlet protrusion 22 and the inlet pipe 32. The coupling portion 25 is a region that is inside a flow channel of the inlet pipe 32, and has a diameter larger than the diameter of the inlet protrusion 22. The inlet protrusion 22 and the inlet pipe 32 are friction-compressed to the refrigerant flow channel of the inlet protrusion 22 by using a jig 60. Thereby, the inlet protrusion 22 and the inlet pipe 32 are compressed corresponding to the shape of the jig 60, and stuck to each other in an air-tight manner. The jig 60 in the present example has an approximately conical leading end portion whose cross-section is approximately triangular. Thereby, the inlet protrusion 22 in the present example has a tapered region formed therein. The jig 60 may be inserted through the refrigerant flow channel of the second cooling unit 30. The inlet protrusion 22 may be swaged at both ends of the inlet pipe 32. Also, an end portion of the inlet protrusion 22 may be welded at the welded portion W at which it is welded with an end portion of the inlet pipe 32.

Figure 14:
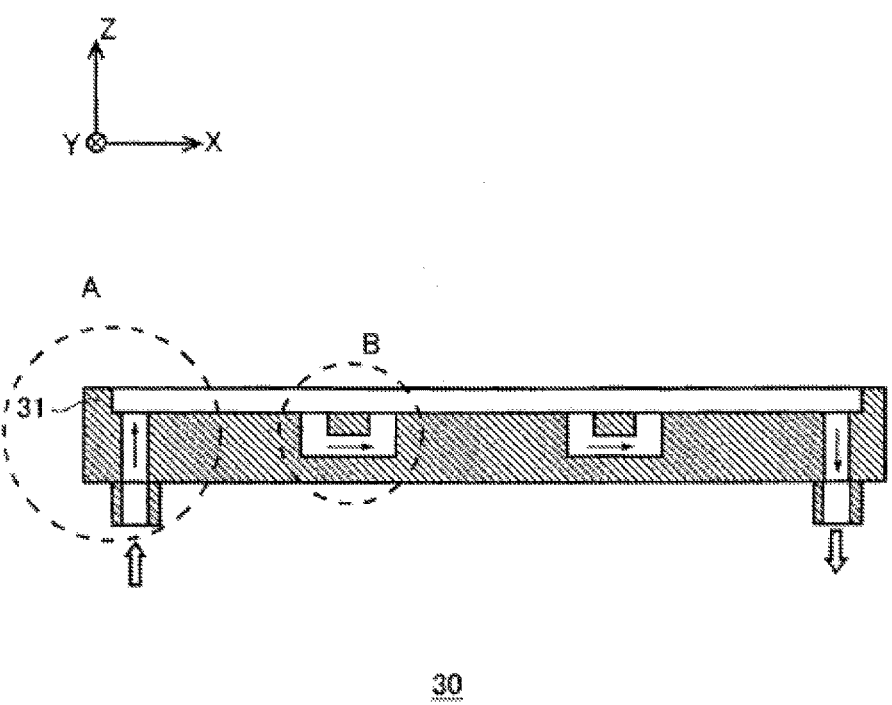
FIG. 14 shows an exemplary cross-sectional view of a second cooling unit 30.

FIG. 14 shows an exemplary cross-sectional view of the second cooling unit 30. The second cooling unit 30 in the present example has a shape that is the same with the shape of the second cooling unit 30 according to the third example. The second cooling unit 30 has a region A and a region B. The region A has a refrigerant flow channel formed penetrating therethrough in the Z-axis direction. Also, the region B has a U-shaped refrigerant flow channel formed not penetrating in the Z-axis direction.

Figure 15A:
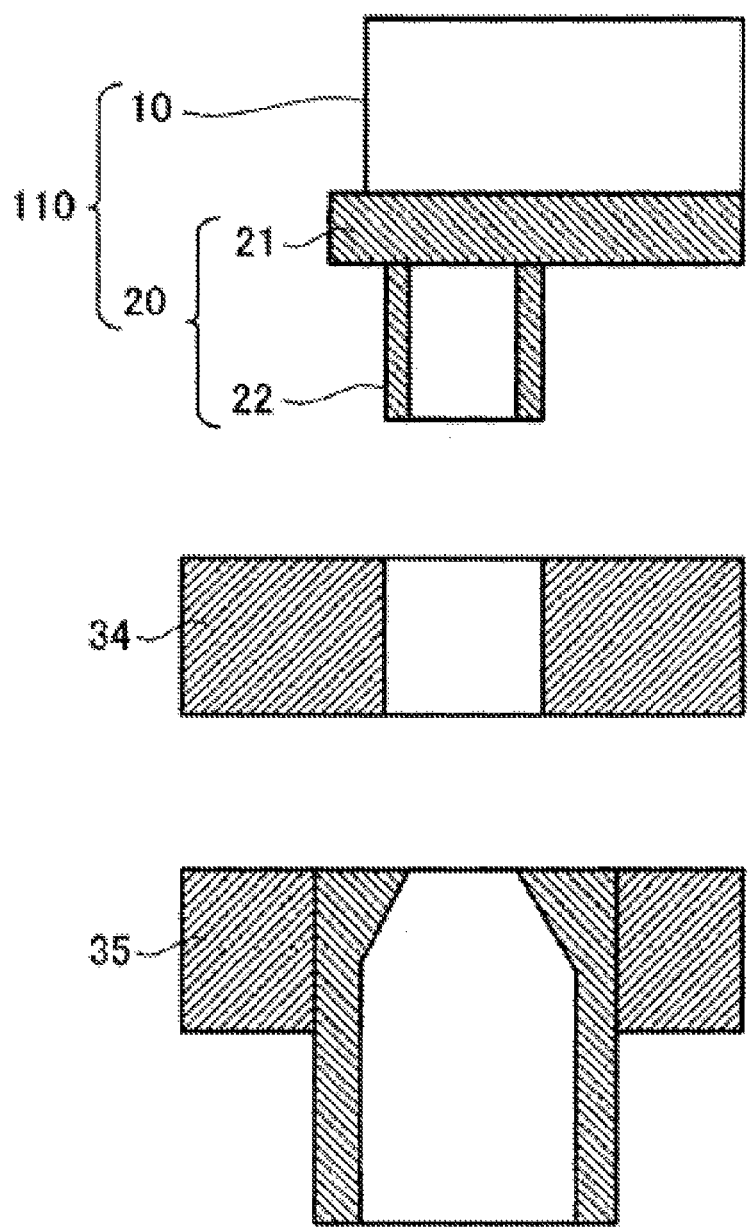
FIG. 15A shows an exemplary method of fabricating a refrigerant flow channel near a region A in FIG. 14.
Figure 15B:
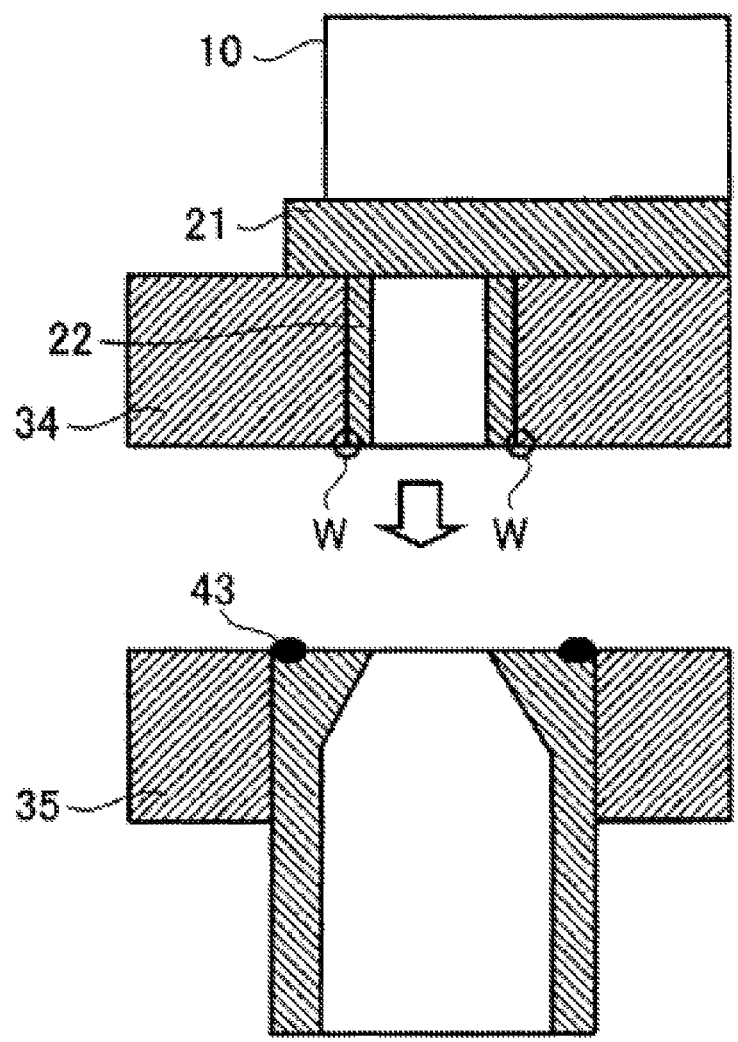
FIG. 15B shows the exemplary method of fabricating a refrigerant flow channel near the region A in FIG. 14.
Figure 15C:
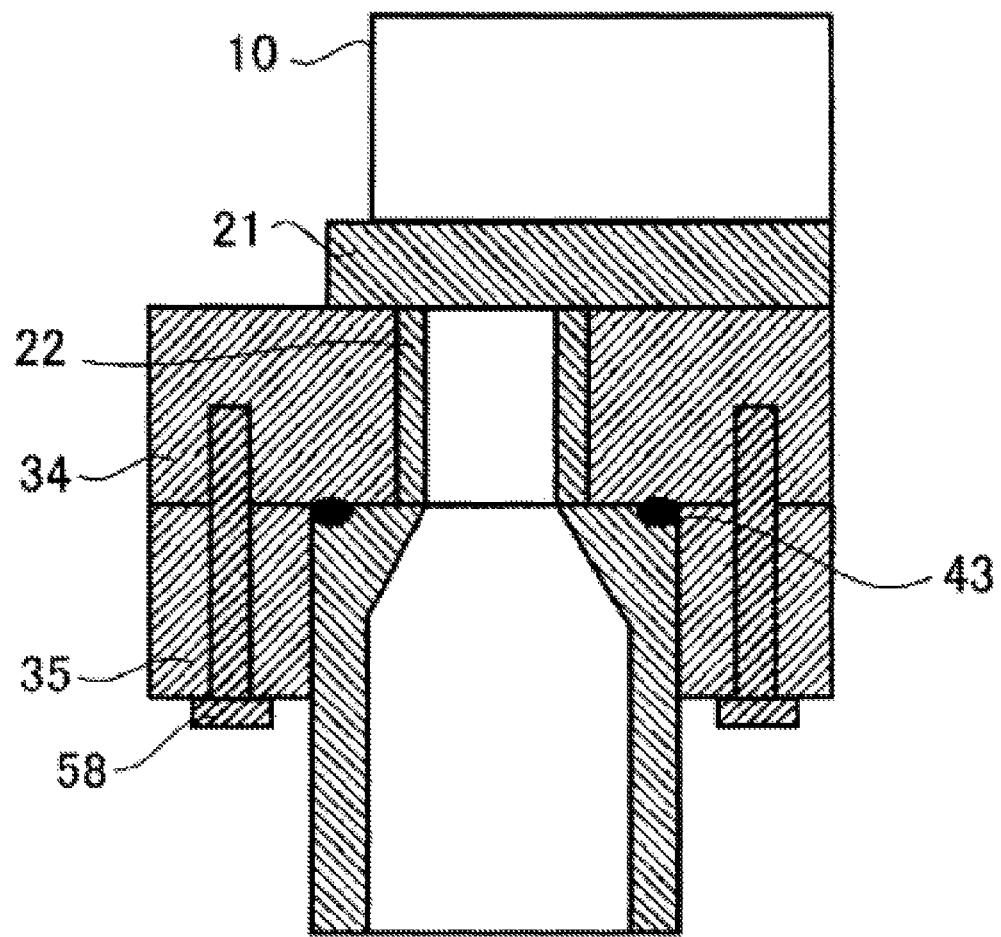
FIG. 15C shows the exemplary method of fabricating a refrigerant flow channel near the region A in FIG. 14.

FIGS. 15A, 15B and 15C show an exemplary method of fabricating a refrigerant flow channel near the region A in FIG. 14.

FIG. 15A shows a state before the cooling-target unit 110, the first plate portion 34 and the second plate portion 35 are coupled with each other. The inlet protrusion 22 of the cooling-target unit 110 is provided corresponding to refrigerant flow channels of the first plate portion 34 and the second plate portion 35.

The first plate portion 34 is fixed to the first cooling unit 20, and has the flow channel coupled with the flow channel of the first cooling unit 20. In one example, the first plate portion 34 has a coefficient of thermal expansion that is lower than that of the first cooling unit 20. For example, the first plate portion 34 is formed of a material that is easy to process such as aluminum.

The first plate portion 34 is fixed to the second plate portion 35, and the second plate portion 35 has the flow channel coupled with the flow channel of the first plate portion 34. The second plate portion 35 may be formed of a material different from that of the first plate portion 34. Also, the second plate portion 35 may be formed of a material that is the same as that of the first cooling unit 20. For example, the second plate portion 35 contains at least one material among copper, a copper alloy, aluminum, an aluminum alloy, iron and a ferroalloy.

The inlet protrusion 22 is formed to align with a lower end portion of the first plate portion 34 in the second cooling unit 30. The inlet protrusion 22 may be formed protruding past the first plate portion 34 to the second plate portion 35 side in the second cooling unit 30.

In FIG. 15B, the cooling-target unit 110 is coupled to the first plate portion 34. The inlet protrusion 22 in the present example has such a length that a distance between its end portions becomes equal to the thickness of the first plate portion 34. Accordingly, an end portion of the inlet protrusion 22 and an end portion of the first plate portion 34 match. Also, the welded portion W is provided in a region in which the inlet protrusion 22 and the first plate portion 34 contact each other, and which is at an end portion of the inlet protrusion 22. An O-ring 43 is provided in a region at an interface between the first plate portion 34 and the second plate portion 35, and around the refrigerant flow channel of the second plate portion 35.

In FIG. 15C, the cooling-target unit 110, the first plate portion 34 and the second plate portion 35 are coupled with each other. The second plate portion 35 in the present example is fixed to the first plate portion 34 by using screw portions 58. The O-ring 43 is provided between the first plate portion 34 and the second plate portion 35. The O-ring 43 is arranged to surround the refrigerant flow channel of the second plate portion 35. Thereby, the O-ring 43 prevents a refrigerant from leaking at a coupling portion between the first plate portion 34 and the second plate portion 35.

The screw portions 58 penetrate the second plate portion 35, and couples with the first plate portion 34 to fix the first plate portion 34 and the second plate portion 35. Also, the screw portions 58 in the present example are arranged to sandwich the both ends of the refrigerant flow channel of the second plate portion 35. Thereby, the screw portions 58 can couple the refrigerant flow channel of the first plate portion 34 and the refrigerant flow channel of the second plate portion 35 with evenly distributed force.

Figure 16A:
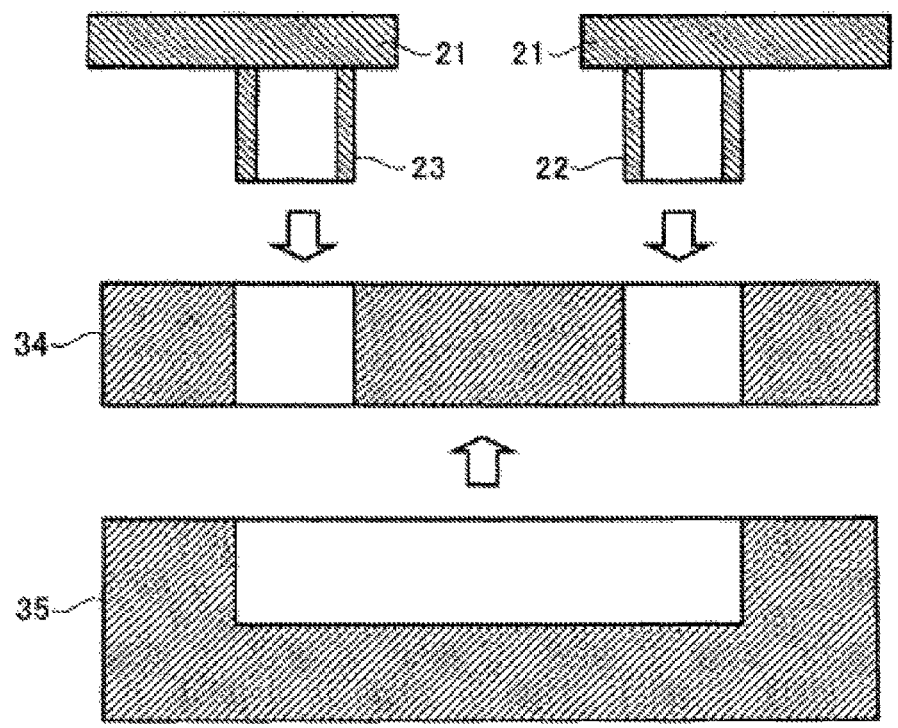
FIG. 16A shows an exemplary method of fabricating a refrigerant flow channel near a region B in FIG. 14.
Figure 16B:
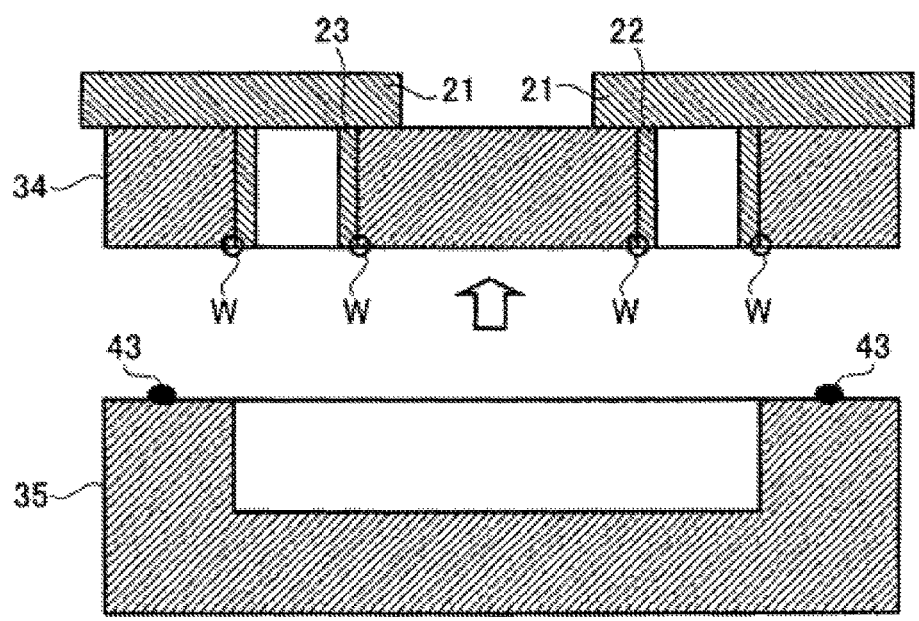
FIG. 16B shows the exemplary method of fabricating a refrigerant flow channel near the region B in FIG. 14.
Figure 16C:
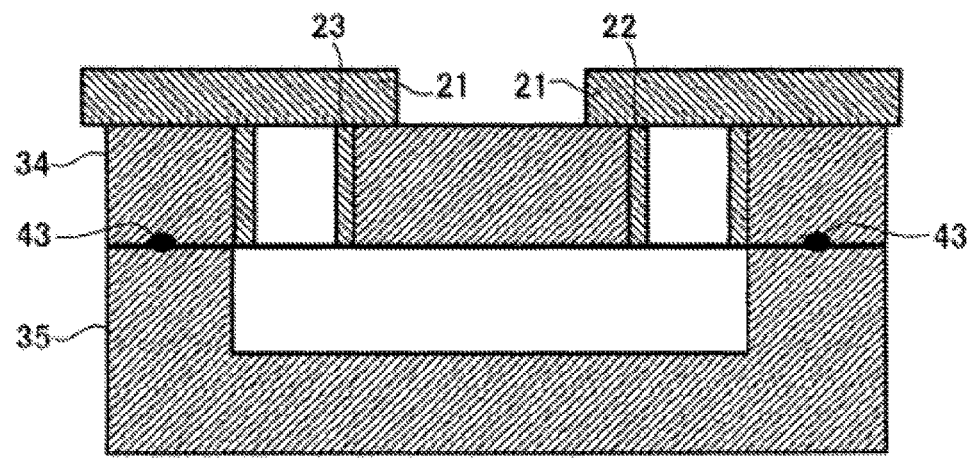
FIG. 16C shows the exemplary method of fabricating a refrigerant flow channel near the region B in FIG. 14.

FIGS. 16A, 16B and 16C show an exemplary method of fabricating a refrigerant flow channel near the region B in FIG. 14.

FIG. 16A shows a state before the first cooling unit 20, the first plate portion 34 and the second plate portion 35 are coupled with each other. The inlet protrusion 22 and the outlet protrusion 23 are provided corresponding to the refrigerant flow channels of the first plate portion 34 and the second plate portion 35. Thereby, positioning of the first cooling unit 20 and the second cooling unit 30 becomes easy.

In FIG. 16B, the first cooling unit 20 is coupled to the first plate portion 34. The inlet protrusion 22 and the outlet protrusion 23 protrude from the heatsink unit 21 to the first plate portion 34 side in the second cooling unit 30. The inlet protrusion 22 in the present example has such a length that a distance between its end portions becomes equal to the thickness of the first plate portion 34. Accordingly, an end portion of the inlet protrusion 22 and an end portion of the first plate portion 34 match. Also, the welded portion W is provided in a region in which the inlet protrusion 22 and the first plate portion 34 contact each other, and which is at an end portion of the inlet protrusion 22.

In FIG. 16C, the inlet protrusion 22, the first plate portion 34 and the second plate portion 35 are coupled with each other. The second plate portion 35 may be fixed to the first plate portion 34 by using the screw portions 58. The O-ring 43 is provided between the first plate portion 34 and the second plate portion 35. The O-ring 43 is arranged to surround the refrigerant flow channel of the second plate portion 35. Thereby, the O-ring 43 prevents a refrigerant from leaking at a coupling portion between the first plate portion 34 and the second plate portion 35.

The refrigerant flow channel of the second plate portion 35 in the present example is formed of a groove formed in the second plate portion 35, and a surface of the first plate portion 34 on the second plate portion 35 side. Thereby, a U-shaped refrigerant flow channel is formed.

Figure 17:
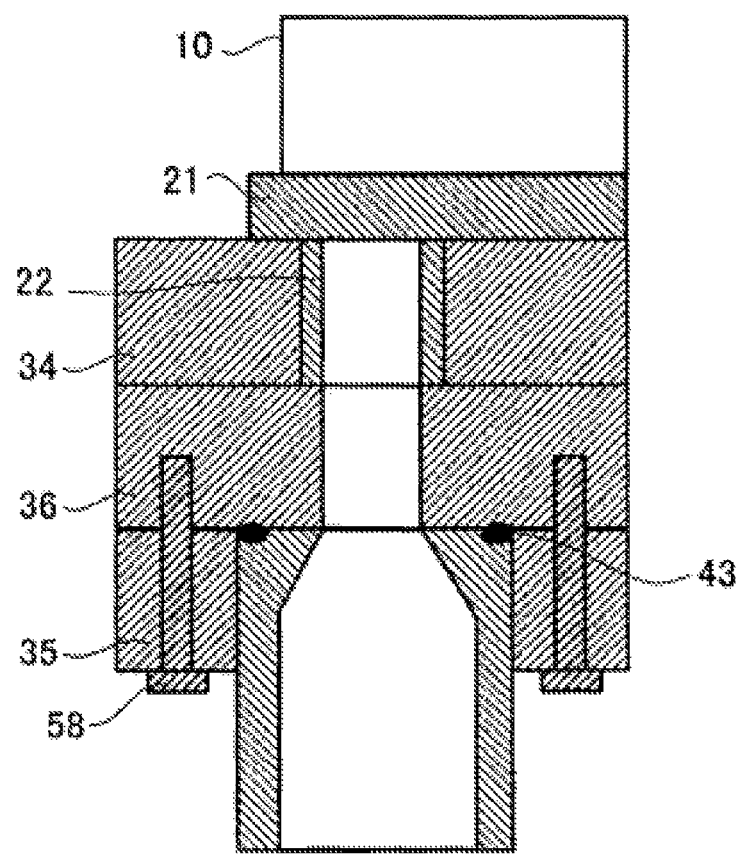
FIG. 17 shows an exemplary method of coupling the semiconductor module 100.

FIG. 17 shows an exemplary method of coupling the semiconductor module 100. In the present example, an enlarged view of a region near the region A of the semiconductor module 100 is shown. The semiconductor module 100 in the present example further includes a third plate unit 36 in addition to the configuration shown in FIG. 15A to FIG. 15C.

The third plate unit 36 is stuck with the first cooling unit 20, and screwed together with the second cooling unit 30 to be arranged between the first cooling unit 20 and the second cooling unit 30. The third plate unit 36 is an exemplary screw plate. The third plate unit 36 is provided between the first plate portion 34 and the second plate portion 35. The screw portions 58 penetrate from a surface of the second plate portion 35 opposite the side on which the third plate unit 36 is formed to the inside of the second plate portion 35. The semiconductor module 100 in the present example has the third plate unit 36 so that as the first plate portion 34, a material that does not have a sufficient mechanical strength relative to the screw portions 58 can be used.

Figure 18:
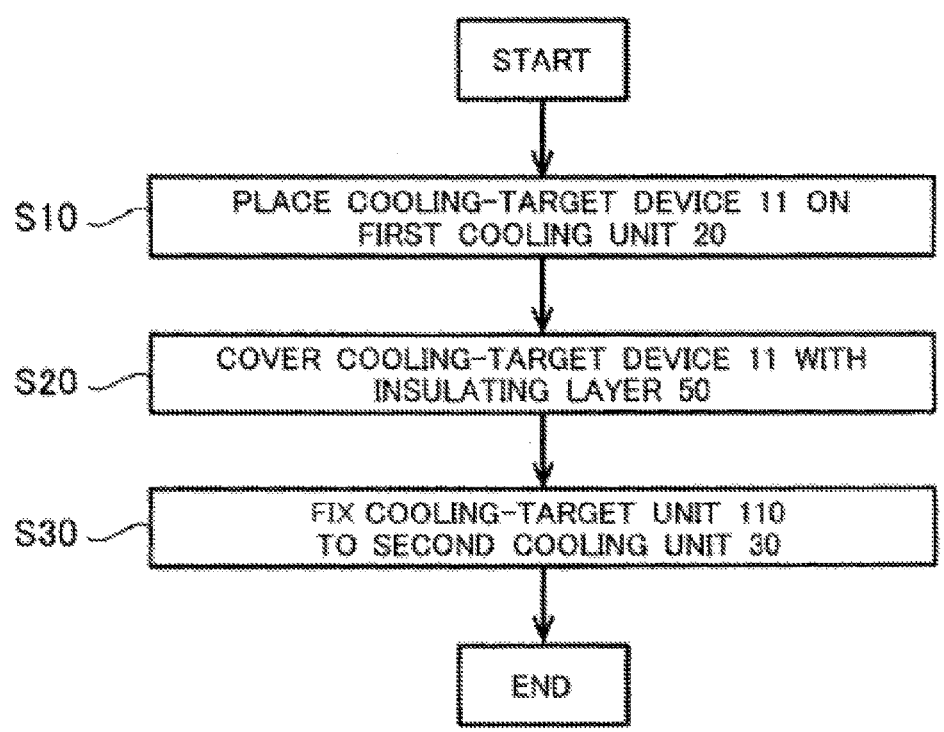
FIG. 18 shows an exemplary method of manufacturing the semiconductor module 100.

FIG. 18 shows an exemplary method of manufacturing the semiconductor module 100. First, the cooling-target device 11 and the first cooling unit 20 are prepared separately from the second cooling unit 30. At Step S10, the cooling-target device 11 is placed on the first cooling unit 20. At Step S20, the cooling-target device 11 is covered by the insulating layer 50. In other words, by Step S20, the cooling-target unit 110 is fabricated. At Step S30, the cooling-target unit 110 is fixed to the second cooling unit 30. The refrigerant flow channel of the first cooling unit 20 is coupled to the refrigerant flow channel of the second cooling unit 30, thereby forming the semiconductor module 100.

In order to form the semiconductor module 100 in the present example, the cooling-target unit 110 in which the cooling-target module 10 and the first cooling unit 20 are integrated is fabricated, and this is fixedly arranged on the second cooling unit 30. In other words, because in the semiconductor module 100 in the present example, the insulating layer 50 and the first cooling unit 20 can adhere to each other rigidly, the reliability of the module bonded portion can be improved.

Also, common members and manufacturing steps can be utilized for the cooling-target unit 110, so the degree of freedom of designing rated capacity increases, an excellent heat-radiating performance can be attained, and the manufacturing cost is reduced. Furthermore, because the semiconductor module 100 allows electrical property tests after assembly for each cooling-target unit 110, only conforming products can be singled out and fixed to the second cooling unit 30, and the yield can be improved.

Figure 19:
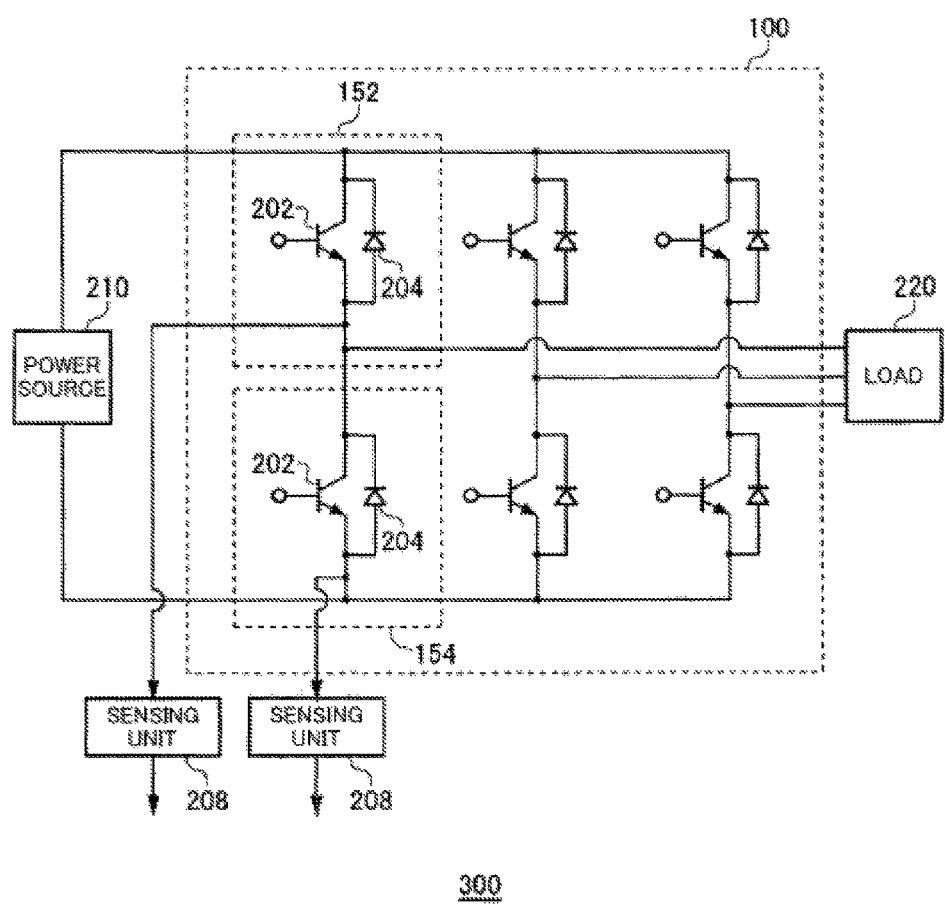
FIG. 19 shows an exemplary circuit 300 constituted with the semiconductor module 100.

FIG. 19 shows an exemplary circuit 300 constituted with the semiconductor module 100. The circuit 300 in the present example is a three-phase inverter circuit provided between a power source 210 and a load 220. The load 220 is a three-phase motor, for example. The circuit 300 converts electric power supplied from the power source 210 into three-phase signals (AC voltage), and supplies them to the load 220.

The circuit 300 has three bridges corresponding to three-phase signals. Each bridge has an upper arm 152 and a lower arm 154 provided in series between a positive-side wire and a negative-side wire. Each arm is provided with a transistor 202 such as an IGBT and a diode 204 such as an FWD. Separate semiconductor chips may be used as the transistor 202 and the diode 204, or a semiconductor chip having, formed therein, an RC-IGBT that serves both the functions may be used. A signal of each phase is output from a connection point between the upper arm 152 and the lower arm 154.

Also, the circuit 300 has two sensing units 208. One of the sensing units 208 detects an electric current at a connection point between the upper arm 152 and the lower arm 154. The other sensing unit 208 detects an electric current at a connection point between the lower arm 154 and a reference potential.

In the present example, the semiconductor module 100 includes three pairs of the upper arm 152 and the lower arm 154. In other words, the cooling-target modules 10a, 10b, 10c each include one pair of the upper arm 152 and the lower arm 154. The upper arm 152 and the lower arm 154 are exemplary cooling-target devices 11. The semiconductor module 100 may include the sensing unit 208.

In the above-mentioned manner, the semiconductor module 100 according to the present specification is used for electric power conversion for an electric automobile, a railway, a machine tool or the like. In manufacturing the semiconductor module 100 according to the present specification, a power semiconductor device having a heat sink is fixedly arranged in a cooler housing after completion of assembly thereof, thereby providing an excellent heat-radiating property, reliability and cost competitiveness.

Also, because in the method of manufacturing the semiconductor module 100 according to the present specification, only cooling-target units 110 that have completed electrical property tests can be mounted to the second cooling unit 30, a method of manufacturing the semiconductor module 100 with a high yield and low cost can be realized. Furthermore, the semiconductor module 100 according to the present specification realizes a small-sized power semiconductor device that has a built-in cooler and has a high heat-radiating property and high electric current capacity, and can be utilized for wind power generation, electric automobiles or the like.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCE SYMBOLS

10: cooling-target module; 11: cooling-target device; 20: first cooling unit; 21: heatsink unit; 22: inlet protrusion; 23: outlet protrusion; 25: coupling portion; 30: second cooling unit; 31: cooler housing; 32: inlet pipe; 33: outlet pipe; 34: first plate portion; 35: second plate portion; 36: third plate unit; 40: substrate; 42: front surface circuit board; 43: O-ring; 44: rear surface circuit board; 46: pin terminal; 48: lead frame; 49: wire; 50: insulating layer; 52: gel layer; 54: resin case; 56: lid; 58: screw portion; 60: jig; 70: external terminal; 100: semiconductor module; 110: cooling-target unit; 152: upper arm; 154: lower arm; 202: transistor; 204: diode; 208: sensing unit; 210: power source; 220: load; 300: circuit; 500: semiconductor module; 510: cooling-target module; 511: cooling-target device; 520: front surface copper circuit board; 522: rear surface copper circuit board; 530: ceramic substrate; 540: cooler; 541: refrigerant flow channel; 550: resin portion; 560: copper pin terminal; 570: external terminal

What is claimed is:

1. A semiconductor module comprising:
a cooling-target device;
a first cooling unit on which the cooling-target device is placed and that has a flow channel through which a refrigerant for cooling the cooling-target device flows; and
a second cooling unit to which the first cooling unit is fixed and that has a flow channel coupled with the flow channel of the first cooling unit;
wherein the cooling-target device is provided at a first side of the first cooling unit, and the second cooling unit is provided at a second side of the first cooling unit opposite to the first side, and
wherein the flow channel of the second cooling unit includes a first connection to the flow channel of the first cooling unit, and a second connection that is not to the flow channel of the first cooling unit.

2. The semiconductor module according to claim 1, further comprising an insulating layer that covers the cooling-target device and at least partially contacts the first cooling unit.

3. The semiconductor module according to claim 1, wherein a volume of a housing of the first cooling unit is smaller than a volume of a housing of the second cooling unit.

4. The semiconductor module according to claim 1, wherein the second cooling unit has a lower thermal conductivity than that of the first cooling unit.

5. The semiconductor module according to claim 1, further comprising a screw that fixes the second cooling unit and the first cooling unit together by penetrating the second cooling unit and coupling with the first cooling unit.

6. The semiconductor module according to claim 1, further comprising a plate unit that is arranged between the first cooling unit and the second cooling unit, fixed to the first cooling unit, and screwed together with the second cooling unit.

7. A semiconductor module comprising:
   a cooling-target device;
   a first cooling unit on which the cooling-target device is placed and that has a flow channel through which a refrigerant for cooling the cooling-target device flows;
   a second cooling unit to which the first cooling unit is fixed and that has a flow channel coupled with the flow channel of the first cooling unit;
   a plurality of the cooling-target devices; and
   a plurality of the first cooling units each of which has at least one among the plurality of cooling-target devices placed thereon, wherein
   the plurality of first cooling units are respectively fixed to the second cooling unit.

8. A semiconductor module comprising:
   a cooling-target device;
   a first cooling unit on which the cooling-target device is placed and that has a flow channel through which a refrigerant for cooling the cooling-target device flows; and
   a second cooling unit to which the first cooling unit is fixed and that has a flow channel coupled with the flow channel of the first cooling unit;
   wherein
   the second cooling unit has:
      a first plate portion that is fixed to the first cooling unit and includes a flow channel coupled with the flow channel of the first cooling unit; and
      a second plate portion that is fixed to the first plate portion and includes a flow channel coupled with the flow channel of the first plate portion.

9. The semiconductor module according to claim 8, wherein at least part of the flow channel of the second plate portion is formed of a groove formed in the second plate portion and a surface of the first plate on the second plate portion side.

10. The semiconductor module according to claim 8, wherein the first cooling unit has a protrusion provided with the flow channel of the first cooling unit, the flow channel protruding to the second cooling unit side.

11. The semiconductor module according to claim 10, wherein the protrusion protrudes from the first cooling unit side to the first plate portion.

12. The semiconductor module according to claim 10, wherein the protrusion penetrates the first plate portion and protrudes past the first plate portion to the second plate portion side.

13. The semiconductor module according to claim 10, wherein the protrusion includes, inside the flow channel of the second cooling unit, a coupling portion that has a diameter which is larger than a diameter of the protrusion.

14. The semiconductor module according to claim 8, wherein the first plate portion includes a material different from that of the second plate portion.

15. The semiconductor module according to claim 8, wherein the second plate portion is formed of a material which is the same as that of the first cooling unit.

16. The semiconductor module according to claim 8, wherein the first plate portion has a coefficient of thermal expansion lower than that of the first cooling unit.

17. A semiconductor module manufacturing method comprising:
   placing a cooling-target device on a first cooling unit that has a flow channel through which a refrigerant for cooling the cooling-target device flows; and
   fixing the first cooling unit to a second cooling unit that has a flow channel coupled with the flow channel of the first cooling unit,
   wherein the cooling-target device is provided at a first side of the first cooling unit, and the second cooling unit is provided at a second side of the first cooling unit opposite to the first side, and
   wherein the flow channel of the second cooling unit includes a first connection to the flow channel of the first cooling unit, and a second connection that is not to the flow channel of the first cooling unit.

18. The semiconductor module manufacturing method according to claim 17, further comprising covering the cooling-target device with an insulating layer after placing the cooling-target device on the first cooling unit.

* * * * *